United States Patent [19]

Kirsch

[11] Patent Number: 4,649,522
[45] Date of Patent: Mar. 10, 1987

[54] FAST COLUMN ACCESS MEMORY

[75] Inventor: Howard C. Kirsch, Emmaus, Pa.

[73] Assignee: AT&T Bell Laboratories, Murray Hill, N.J.

[21] Appl. No.: 700,459

[22] Filed: Feb. 11, 1985

[51] Int. Cl.[4] .............................................. G11C 13/00
[52] U.S. Cl. .................................... 365/189; 365/230
[58] Field of Search ....................... 365/189, 230, 182

[56] References Cited

PUBLICATIONS

"C-MOS 256-K RAM With Wideband Output Stands by on Microwatts", *Electronics*, E. Hamdy et al, Jun. 14, 1984, pp. 138–143.
"64K Dynamic RAM-The High Density Solution for the 80's", *MIDCON/81 Conference Record*, vol. 23/1/1-5, M. K. Phinney, Nov. 10-12, 1981, pp. 1–5.
"51C64 Family 65,536x Bit CHMOS Dynamic RAM", *Intel Preliminary*, 1983, pp. 1–15.
"A 100 ns 256K DRAM with Page-Nibble Mode", 1983 *IEEE International Solid-State Circuits Conference*, K. Fujishima et al, Feb. 25, 1983, pp. 228–229 and 310.
"A 100 nx 64K Dynamic RAM Using Redundancy Techniques", 1981 *IEEE International Solid-State Circuits Conference*, J. Brady et al, Feb. 18, 1981, pp. 84–85.
"Static Column RAM Almost Doubles Data Rates", *Electronic Design*, Feb. 23, 1984, pp. 259–263.
"MOS 65536-Bit Static Column Dynamic Random Access Memory", *Fujitsu Preliminary*, Feb. 1983, pp. 1–18.
"A 35 ns 65K Static Column DRAM", *IEEE Journal of Solid-State Circuits*, vol. SC-18, No. 5, F. Baba et al, Oct. 1983, pp. 447–451.

*Primary Examiner*—Terrell W. Fears
*Attorney, Agent, or Firm*—James H. Fox

[57] ABSTRACT

A dynamic random access memory obtains improved access time for reading data from a multiplicity of memory cells along a given selected row. This is obtained by allowing the output data line to remain active between activations of a column enable signal. An increase in data valid time at the memory output is obtained, while allowing increased latitude in memory address setup time.

5 Claims, 6 Drawing Figures

FAST COLUMN ACCESS MEMORY

BACKGROUND OF THE INVENTION

1. Field of the Invention

The present invention relates to a dynamic random access memory having improved capability for accessing memory cells located along a common row.

2. Description of the Prior Art

A dynamic random access memory (DRAM) comprises individual memory locations, referred to as "cells", arranged in an array of rows and columns. A given memory cell is located in the vicinity of the intersection of a row conductor and a column conductor. The cell is "accessed" to perform a data read or write operation when the corresponding row and column conductors are activated. Referring to FIG. 1, a typical DRAM design utilizes a row decoder to select a given row by placing a voltage thereon, which is positive in the case of n-channel field effect access transistors. This row conductor voltage allows all of the access transistors in the selected row to conduct charge between an information storage capacitor and the column conductor associated with each selected cell. Similarly, a column decoder is utilized to select a given column of memory cells for connection to data output (DQ and $\overline{DQ}$) lines.

For example, if row R1 and column conductor C1 are selected, then data may be written (stored) or read (retrieved) from capacitor 11 by conduction through access transistor M11. Note that a given column conductor (e.g., C1) typically has associated with it a complement column conductor (e.g., $\overline{C1}$) that is also selected for the given column. The complement column conductor provides a reference voltage during read operations so that the sense amplifier for the selected column (e.g., sense amp 1) can rapidly determine whether a high voltage, referred to as a "1", or a low voltage, referred to as a "0", is stored in the selected memory cell. The column functions are interchangeable, so that C1 may be selected to read a given cell (e.g., M21-21), with $\overline{C1}$ then serving as its complement conductor, as when row conductor R2 is selected. The selected column conductor (e.g., C1) communicates the data to the DQ line, and the selected complement column conductor (e.g., $\overline{C1}$) communicates the complement data to the $\overline{DQ}$ line. The Q buffer then provides valid data output when a strobe signal (CQL) is present, assuming the Q buffer is not placed in the "tristate" condition by a high level on $\overline{CE}$ or the clock early write (CEW) signal.

In order to select the desired row and column, address bits are supplied to the row and column decoders. For example, to select one row out of 256 rows, 8 address bits (A1 ... A8) are supplied to the row decoder, since $2^8 = 256$. Similarly, to select one of 256 columns, 8 other address bits (A9 ... A16) are supplied to the column decoder. This provides access to any one of $256 \times 256 = 65,536$ memory cells. Other array sizes may be provided for by using different numbers of address bits.

In typical DRAMs, the address bits are time multiplexed into two groups, with the row address bits being applied first to the address terminals, and then the column address bits. In this way, the number of integrated circuit terminals can be reduced. For example, the exemplary array of FIG. 1 needs only 8 address terminals when thus multiplexed, instead of 16. To accomplish this address multiplex function, the first group of 8 bits (row bits A1 ... A8) are placed on the address terminals by the circuitry requesting memory access, and then latched into the row decoder by a "row enable" signal, $\overline{RE}$, also referred to as "row access strobe", $\overline{RAS}$, in the art. Next, the column bits (A9–A16) are placed on the address terminals, and latched into the column decoder by a "column enable" signal, $\overline{CE}$, also known as the "column access strobe", $\overline{CAS}$, in the art. After a short delay, referred to as the "access time" ($T_{ACC}$), the desired memory cell is selected, and in the case of a read operation, the stored data appears on the DQ line (and its complement on the $\overline{DQ}$ line). This sequence of operations is illustrated in FIG. 2. Note that the row and column address bits are maintained valid for the times indicated on the "ADR" graph, and similarly for the data bits on the "Q" graph.

In one conventional mode of memory operation, the $\overline{RE}$ signal is again applied (e.g., a high to low transition), followed by the $\overline{CE}$ signal, when the next memory data bit (e.g., data bit 2) is to be accessed for a read operation. This data bit 2 assumes a high or low voltage level, depending upon whether a "1" or "0" is stored at the selected location, during a second period of valid data time. However, note that the first and second valid data periods are separated by a minimum time interval, $T_{INV}$, when the data output is invalid. This is accomplished by allowing the Q output of the Q buffer to assume a high impedance state, referred to as the "tristate" condition. The tristate condition effectively disconnects the Q output, and hence the data input/output (I/O) terminal of the memory, from the memory array information.

The purpose of the tristate interval is to allow two or more memory arrays, typically implemented on separate integrated circuit chips, to connect via a common input/output conductor, referred to as a "data bus"; see FIG. 3. Then, when one of the memories, for example memory 1, is providing a valid data output in response to an access request, the other memories connected to the bus (memories 2 ... N) are in the tristate condition. This ensures that these other memories do not interfere with the accessed memory. Such interference could occur, for example, if memory 1 was providing a "1" data bit to the data bus, and another of the memories was providing a "0" data bit. During the next memory cycle, another of the memories, say memory 2, may be selected to provide the data output, with the other memories then being placed in the tristate condition. Note that which of the memories is providing the valid data, and which of the other memories are in the tristate condition, can be controlled by the individual $\overline{CE}$ signal applied thereto, since a high $\overline{CE}$ signal places a given memory in the tristate condition in a typical memory design.

Other modes of memory operation have also been utilized, generally in an attempt to reduce the time to access a desired memory location. For example, the above-noted address multiplex scheme requires twice as much time to input the necessary address bits than if both row and column address bits were presented simultaneously to the memory, as is the case with most static memory designs. Various schemes have been used to reduce this time penalty. In particular, the "page mode" scheme allows any of the memory cells along a selected row to be accessed by simply supplying the desired column address and the $\overline{CE}$ signal to the memory for each data access request. That is, the row address and the $\overline{RE}$ signal is supplied only once, as long as the desired memory cells are located in the selected row. Hence, a significant time saving can be achieved. However, prior art page mode schemes have retained the tristate period between valid data output periods.

A more recent "static column" technique is somewhat similar to page mode, except that even the column enable ($\overline{CE}$) signals are not required when accessing cells located along a selected row. Rather, the column address bits themselves (e.g., A9-A16 above) are detected by means of transition detectors, which then select a new column when these bits are changed. That technique eliminates the tristate period, since a new cell provides valid output data (allowing for an unavoidable transition period) as soon as it is selected by a new address. However, the column address bits then must be maintained valid on the address terminals at least as long as valid output data is desired.

Another technique, referred to as "ripple mode", is similar to page mode, with one significant difference being that the column address bits begin to flow into the (static) column decoders when the $\overline{CE}$ signal goes high. Then, the addresses are latched into the address buffers when $\overline{CE}$ goes low. This technique allows somewhat greater latitude in the available time window between the $\overline{RE}$ low and CE low signals; see "C-MOS 256-K RAM with Wideband Output Stands by on Microwatts", A. Mohsen et al, *Electronics*, June 14, 1984, pp. 138-143. (In contrast, in page mode the column address bits must be valid when $\overline{CE}$ goes low, and for a fixed hold time thereafter. This allows the column decoder time to sample and latch the column addresses.)

Still another addressing technique, referred to as "nibble mode", provides four data output bits when a given memory location is specified. The four bits are time-multiplexed onto a single I/O terminal, and the data remains valid (except for transition times) during the four-bit output period. However, the output is then tristated when a new location is specified. Furthermore, the four data bits are typically not all obtained from the same row of memory cells per access request.

SUMMARY OF THE INVENTION

I have invented a random access memory having an improved access capability. The memory cells are typically of the dynamic type. Other memory types having time multiplexed row and column addresses are possible. The inventive memory includes means for retaining data valid between applications of a column enable signal when accessing memory cells located along a given selected row. Means are also included for placing the data output line in a tristate condition, thus allowing the connection of two or more memories to a common I/O line.

DETAILED DESCRIPTION

The following detailed description relates to a dynamic random access memory having improved accessing capability for data read operations. The present technique results from a recognition of inadequacies of the various prior art techniques that limit their usefulness in actual system applications in many cases. In particular, the present technique allows for more time latitude in applying address information to the memory, while still obtaining the capability to rapidly access memory cells located along a common row. An overall increase in the rate of reading data from the memory is thereby possible.

Figure 4:
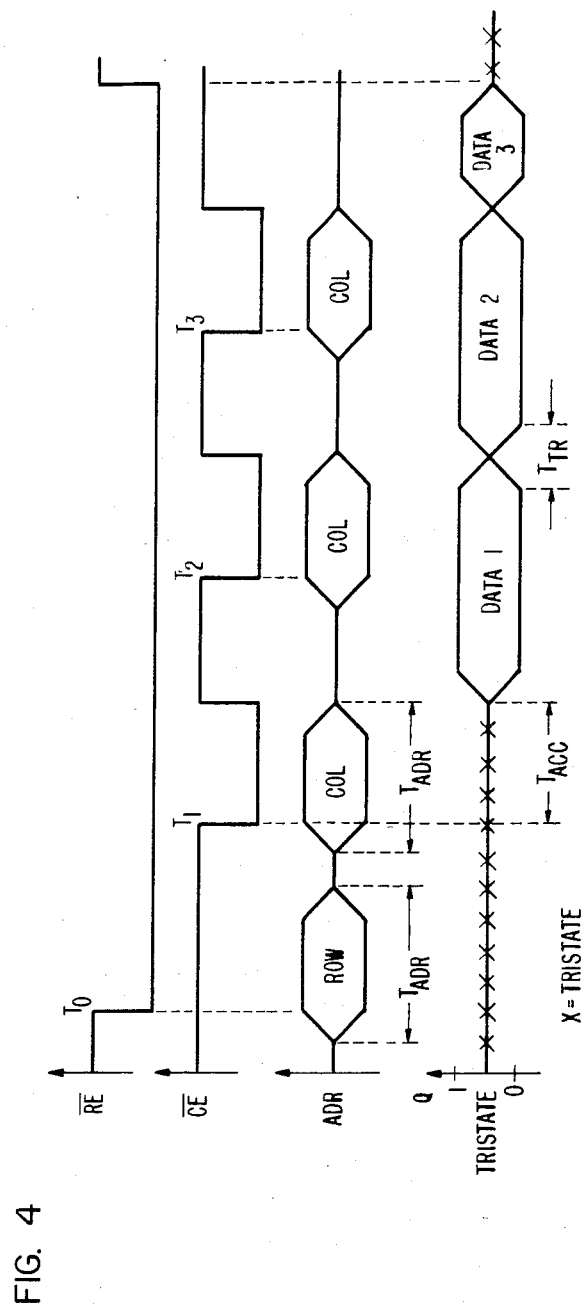
FIG. 4 illustrates typical control and data signal voltages as a function of time for the present inventive technique.

Referring to FIG. 4, the present technique is illustrated in terms of control signal voltages, address states, and output line states for a read operation. The read cycle is initiated when $\overline{RE}$ goes low, assuming $\overline{CE}$ is high. At the time of this transition, $T_0$, the row address information (e.g., bits A1-A8) is required to be valid at the multiplexed address input terminals for the memory, and to remain valid for a minimum hold time, $T_{ADR}$. This transition of $\overline{RE}$ causes the row decoder to initiate the selection of the row of memory cells thus specified. Then, the address input terminals are supplied with the column address information (e.., bits A9-A16), and the column enable signal $\overline{CE}$ initiates the column decoding process by a low transition at time $T_1$. During $T_{ADR}$, the column address bits are sampled by the column address decoder, and then latched. A fixed access time ($T_{ACC}$) after $T_1$, a valid data output signal from the selected cell appears on the Q line. This data remains valid, that is at a "1" or "0" logic level, throughout the remaining time period that $\overline{CE}$ remains low, and also throughout the following $\overline{CE}$ high period, if $\overline{RE}$ remains low, as shown. The next $\overline{CE}$ low transition, at time $T_2$, then initiates the column decoder selection for the next column specified by the column address bits then valid on the address input terminals. After the decoding delay, a valid data output signal then appears on the Q output. Note that, except for a transition time ($T_{TR}$) between selected columns (typically about 5 nanoseconds in one current design), the data output remains valid. That is, the Q output is not placed in a tristate (high impedance) condition between selected columns of a given selected row. Note also that the data bit (e.g., data 1) for a given selected column remains valid for a certain time period after the next column selection is initiated (e.g., at $T_2$).

Figure 3:
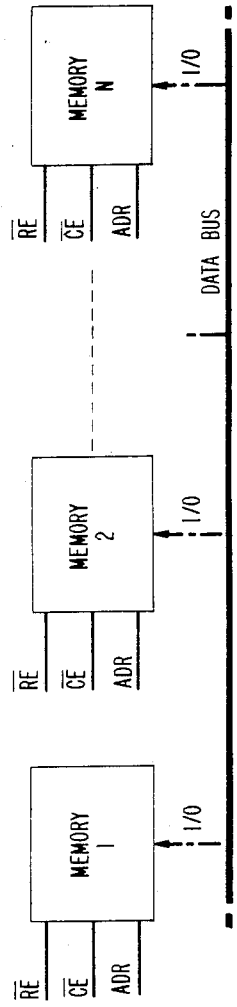
FIG. 3 illustrates a plurality of memories connected to a single data bus.

The foregoing technique has significant advantages compared to prior art techniques. Firstly, it eliminates the time lost due to the tristate condition between selected columns along a given row. This allows higher effective data rates during memory readout. This advantage results from the recognition that when reading cells located along a common row, a typical system in which the memory is used does not require sharing the I/O line among several memories (FIG. 3). Rather, the data stored along a given row can be arranged to be largely sequential within a given memory chip, so that interleaved memory requests among several chips are not frequently necessary, and hence the tristate condition is not necessary during this time.

However, the present technique retains the option of entering the tristate condition. Referring again to FIG.

4, the tristate condition on the Q output, and hence the I/O line, is selected when both the $\overline{RE}$ and $\overline{CE}$ signal are in the high state. This allows, for example, for interleaving of memory requests to various rows of memory cells in two or more memory chips connected via a common I/O bus. Then, the high speed of the present technique is obtained for memory cells selected along a common row of a given chip, while still allowing an expanded memory space by the use of multiple chips along the I/O line. Other techniques can be used to select the tristate condition. For example, a separate "output enable" terminal, referred to as $\overline{OE}$ or $\overline{G}$ in the art, may be used to select tristate when desired.

A second advantage of the present technique relates to the time ($T_{ADR}$) required for address information to remain valid on the column address input terminals. Unlike certain of the prior art techniques, this time is a fixed time determined by the minimum time required for proper sampling of the column address bits by the column decoder. As indicated in FIG. 4, this time is typically less than the time that the data remains valid on the Q line for a given column selection. In fact, $T_{ADR}$ can be as short as 15 nanoseconds in one current design. Note that the address bits must remain valid only for this fixed minimum time after the low transition of $\overline{CE}$ which selects the corresponding column. Then, the addresses are free to change to a new state in preparation for the next cell selection, while retaining valid data output on the I/O line. In other words, the time required for address (input) information to remain valid is minimized, while the time allowed for memory data (output) to remain valid is maximized by the present technique for any given cycle time.

Also, referring to FIG. 4, it is seen that a given data bit (e.g., data 1) remains valid for a fixed time into the next $\overline{CE}$ period. That is, the given data bit does not change to the next data bit (e.g., data 2) until a fixed time after the next column enable signal is applied (e.g., at $T_2$). (In one current design, this fixed time is about 10 nanoseconds.) It can be seen that this allows the $\overline{CE}$ period, that is, the time difference between $T_1$ and $T_2$, to equal the column access time ($T_{ACC}$). This technique guarantees that valid data will remain on the I/O line during multiple read operations for this fixed time even if the memory is being accessed at its fastest cycle rate.

The foregoing advantages have important implications for systems utilizing the inventive memories: One limiting factor in utilizing conventional DRAMs is the time differential between the first and last address bits to become valid on the address input terminals of a memory. This condition, referred to as "address skew", may result from various time differences in the delays associated with providing the address bits to the memory. These differences can include computational time differences required to specify the different address bits, and/or differential path delays between the requesting circuitry and the memory. The present technique provides the system designer with an increase in the time allowed for address skew for a given output data valid time, thus easing system timing problems and increasing system performance. Additionally, as noted above, the output data remains valid for the maximum amount of time possible during a memory cycle for cells selected along a common row. This again simplifies system design and allows increased performance, by allowing the requesting circuitry additional time to respond to the requested data. Furthermore, the present technique allows the column enable ($\overline{CE}$) signal to operate at a 50 percent duty cycle, even at the highest data rates. That is, the $\overline{CE}$ high and low times can be equal during multiple memory accesses along a common row. This provides the minimum possible bandwidth for the circuitry providing the $\overline{CE}$ signal. This is a significant convenience in systems operating from a master clock, as $\overline{CE}$ may be conveniently derived from the master clock signal.

Figure 6:
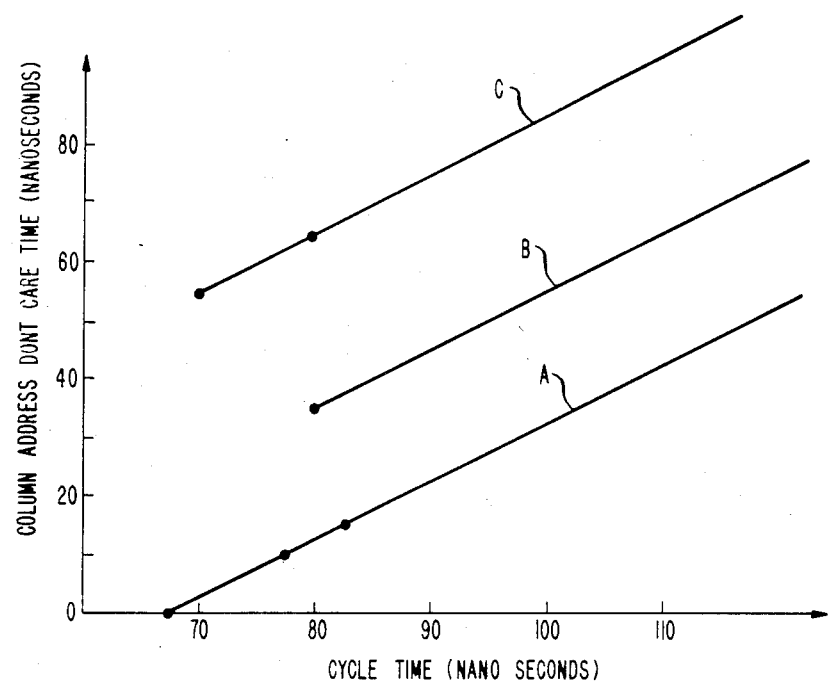
FIG. 6 illustrates the advantage of the present technique in terms of allowable address "don't care" time versus cycle time.

An indication of the improvement in performance gained by the present technique can be seen by comparing typical prior art memories with the inventive memory. Referring to FIG. 6, a graph shows the amount of column address "don't care" time versus the memory cycle time for two prior art memories (lines A and B) and the inventive memory (line C). The address don't care time is the time that a given memory provides the user to input the necessary column address information, once a given row has been selected. The don't care time includes the transition time during which the address bits change voltage levels from the previous address state, and also the skew time, which is the time difference between the arrival of the first and last address bits at the memory address terminals, as noted above. The cycle time is the access time required to supply the data stored in a requested memory cell after the $\overline{CE}$ low transition, and also includes a time period for allowing the data to remain valid on the I/O line. The access time is 50 nanoseconds for the memories represented by lines B and C, and 55 nanoseconds for the memory of line A.

Line A in FIG. 6 represents a "static column" prior art memory that utilizes address transitions to initiate column selections, with the concomitant requirement that the address bits remain valid for at least the period during which the data output remains valid; this data valid period is assigned to be 15 nanoseconds for line A. Line B represents another prior art memory, operating in the ripple mode. It is also assigned a data valid time of 15 nanoseconds for the purpose of calculating the values for line B, and it is further assumed that $\overline{CE}$ remains high for 35 nanoseconds per access. Finally, line C represents a memory according to the present invention, wherein the data valid time is assigned a value of 30 nanoseconds. It can be seen that even though the data output remains valid for twice as long for the inventive memory (line C) as for the representative prior art memories (lines A and B) the inventive memory provides significantly longer address don't care time for any given cycle time. For example, at a 100 nanosecond cycle time, the inventive memory allows 85 nanoseconds for address don't care time, versus only 55 nanoseconds and 32 nanoseconds for the memories of lines B and C, respectively. An alternate way of interpreting this graph is to note that for a given address don't care time (e.g., 55 nanoseconds), the inventive memory provides a much shorter cycle time (70 nanoseconds) than the other memories (100 nanoseconds and 122 nanoseconds). (The ripple mode memory of line B can more closely approach the performance of line C, if the $\overline{CE}$ high time is reduced from the assumed value. However, that increases the bandwidth requirements on the circuits providing the $\overline{CE}$ signal. Hence, a system can be designed to operate at significantly higher data read rates using the present memory.

Figure 1:
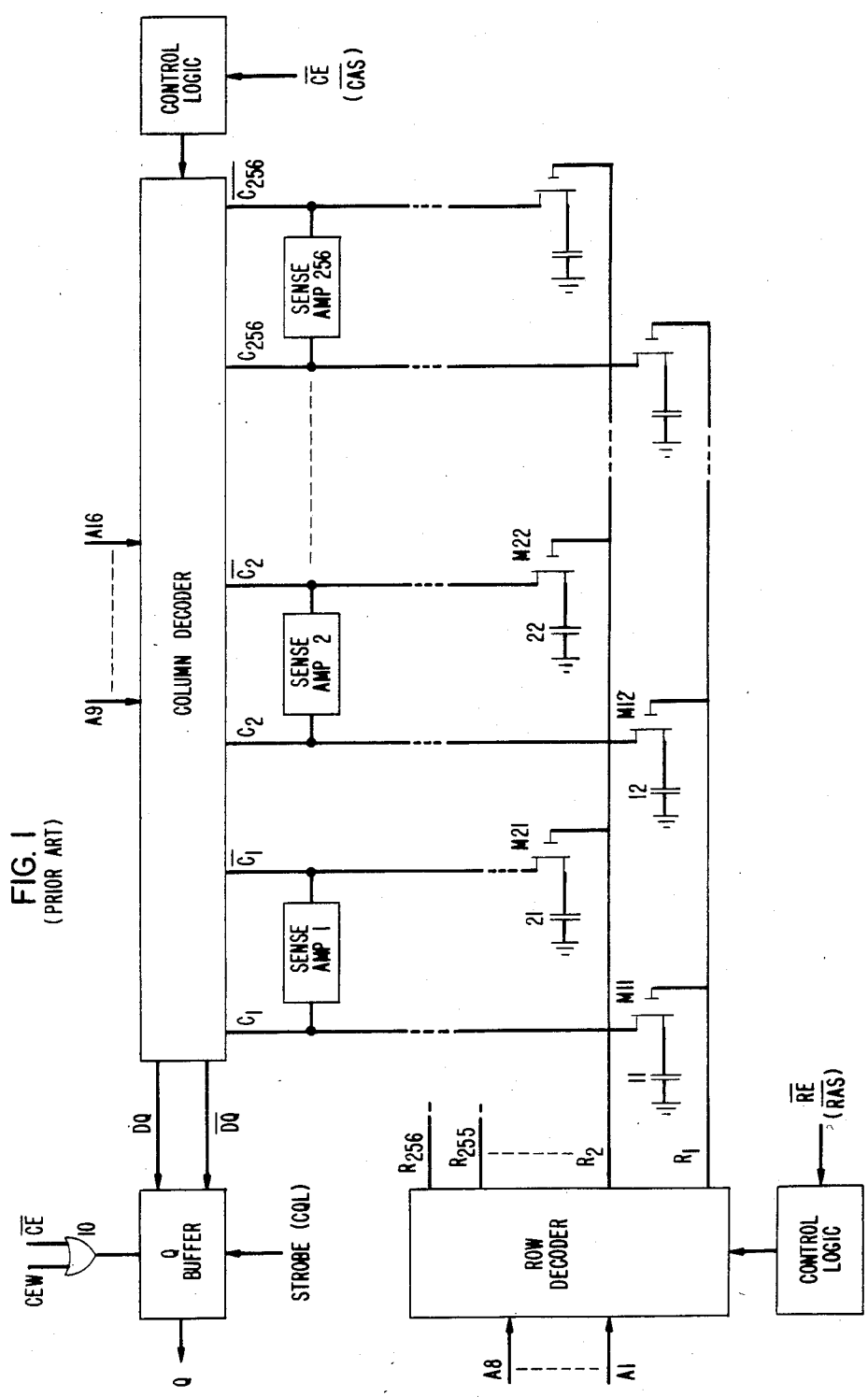
FIG. 1 illustrates a typical dynamic random access memory array and associated decoders.
Figure 2:
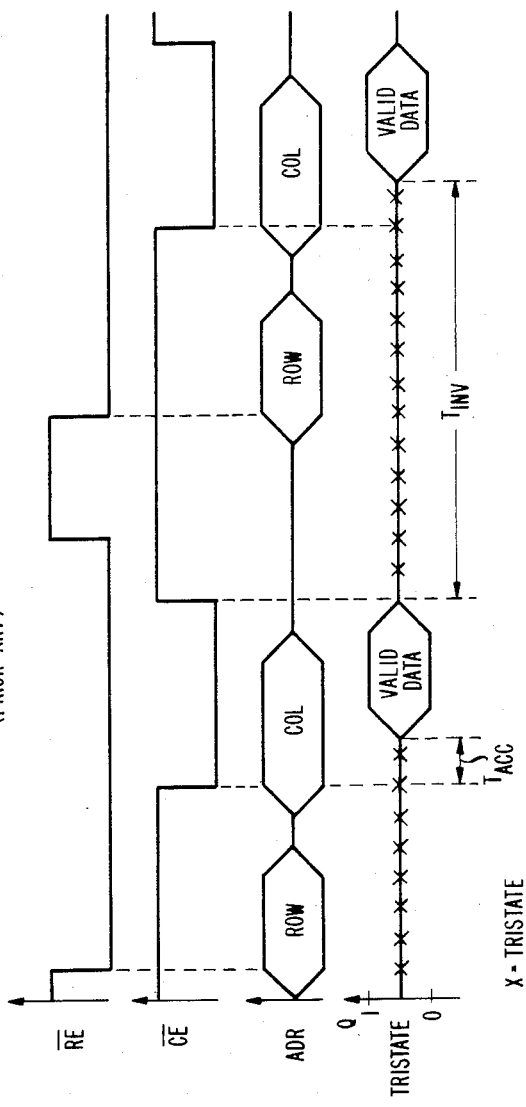
FIG. 2 illustrates typical control and data signal voltages as a function of time for the memory of FIG. 1.
Figure 5:
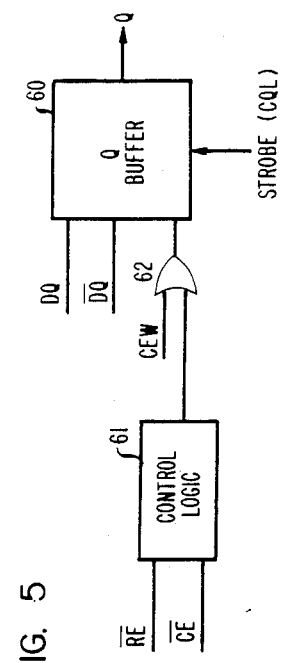
FIG. 5 illustrates logic circuitry suitable for implementing the present technique.

A memory may be implemented according to the present technique as indicated in in FIG. 5, with other schemes also being possible. The data output line, designated "Q", is controlled by a tristate buffer (60) having logical inputs as shown. The DQ and $\overline{DQ}$ lines from the memory array (FIG. 1) are input into this buffer. The strobe (CQL) input latches the data from the DQ lines into the buffer, typically by means of a signal derived from the column decoder control logic receiving the $\overline{CE}$ input (FIG. 1). Also, the $\overline{RE}$ and $\overline{CE}$ signals are applied to logic circuit 61, the output of which is applied to OR gate 62. In operation, the control logic (61) provides that when both $\overline{RE}$ and $\overline{CE}$ are high, the output of 61 is high. Hence, the output of gate 62 is high, and the buffer 60 places the data output line Q in the tristate (high impedance) condition. The control logic 61 provides a low output whenever $\overline{CE}$ first goes low following a $\overline{RE}$ low transition. Hence, the buffer (60) allows valid data output on line Q, assuming CEW is low. Also, the control logic output remains low, so that the Q buffer provides valid data to the Q output, during one or more successive $\overline{CE}$ high to low transitions, as one or more subsequent column addresses select memory locations along the selected row. This state continues until both $\overline{RE}$ and $\overline{CE}$ go high, placing the Q output, and hence the associated I/O line, in the tristate condition. Note also that the clock early write (CEW) signal is an input to OR gate 62. When CEW is high, as during a write operation into the memory, the buffer 60 also sets output line Q in the tristate condition. At other times, when CEW is low, the buffer is allowed to respond to $\overline{RE}$ and $\overline{CE}$ as noted. As noted above, an additional input terminal ($\overline{G}$ or $\overline{OE}$) may be connected to an additional input (not shown) of gate 62, to provide tristate control from an input terminal of the integrated circuit.

A memory according to the present technique may optionally provide for page mode operation. This may be accomplished, for example, by setting the $\overline{RE}$ input of control logic 61 to a high level for the duration that page mode operation is desired. This may be accomplished by means of a separate page mode input control terminal, or by a permanent wiring option as the metal mask level for a given chip. Still other control options are possible.

A memory according to the present technique may also provide for multiple memory locations (e.g., 4, 8, or 16 bits, etc.) to be simultaneously read out onto a corresponding number of I/O terminals. If desired, each I/O terminal may be associated with a separate selected row of memory cells, or alternately, with different portions of a single selected row. In either case, the present inventive technique allows for valid output data to be obtained on each I/O terminal during multiple column selections along a selected row.

Note that while a separate row and column decoder are shown in FIG. 1, it is possible to combine these functions into a single time-multiplexed decoder, as is known in the art. Also, the row decoder may be placed in the middle of a memory array, with the rows then extending from either side of the decoder. While a memory according to the present technique may be implemented as a discrete integrated circuit chip that communicates through terminals with other circuits, it is also possible to implement the present memory in wafer scale integrated circuit form. Then, a common I/O bus may be used to connect a multiplicity of the inventive memories together on a single wafer, while may also include computational circuitry. Finally, while the present technique is advantageously used with dynamic random access memories, the memory can be of other types. For example, static cell types, read only memory (ROM) types, programmable read only memory (PROM) types, etc. can advantageously use the present technique if the memory uses time multiplexed row and column address bits, typically applied to a common set of input terminals.

What is claimed is:

1. An integrated circuit random access memory comprising: a multiplicity of memory cells;

row decoding means adapted to select a desired row of memory cells when a row enable signal ($\overline{RE}$) is applied; column decoding means adapted to accept a column address and to select a specified column of memory cells each time a column enable signal ($\overline{CE}$) is applied;

CHARACTERIZED IN THAT said integrated circuit further comprises means for providing valid output data read onto a data output line from at least two selected memory cells located on a given selected row, with said providing beginning with the first application of said column enable ($\overline{CE}$) signal following an application of said row enable ($\overline{RE}$) signal, and ending when both said row enable ($\overline{RE}$) and column enable ($\overline{CE}$) signals are terminated, and with said data output line being placed in a high impedance state at times other than said providing.

2. The integrated circuit of claim 1 wherein an input terminal ($\overline{G}$) is provided for placing said output line in a high impedance state.

3. The integrated circuit of claim 1 wherein one memory cell is selected per application of said column enable signal.

4. The integrated circuit of claim 1 wherein more than one memory cell is selected per application of said column enable signal, and wherein a separate output means is provided for the data output of each cell selected per said application.

5. The integrated circuit of claim 1 wherein said means for providing valid output data allows said data read in response to a given application of said column enable signal to remain valid for a given period after the next application of said column enable signal.

* * * * *

UNITED STATES PATENT AND TRADEMARK OFFICE
CERTIFICATE OF CORRECTION

PATENT NO. : 4,649,522

DATED : March 10, 1987

INVENTOR(S) : Howard C. Kirsch

It is certified that error appears in the above-identified patent and that said Letters Patent is hereby corrected as shown below:

Column 1, line 33, "Cl" should read --$\overline{Cl}$--.

Column 1, line 40, "Cl" should read --$\overline{Cl}$--.

Column 3, line 26, "CE" should read --$\overline{CE}$--.

Signed and Sealed this

Twenty-seventh Day of October, 1987

Attest:

DONALD J. QUIGG

*Attesting Officer*         *Commissioner of Patents and Trademarks*